United States Patent
Consoli et al.

(10) Patent No.: US 10,587,064 B1
(45) Date of Patent: Mar. 10, 2020

(54) CIRCUIT CARD ASSEMBLIES FOR A COMMUNICATION SYSTEM

(71) Applicant: TE CONNECTIVITY CORPORATION, Berwyn, PA (US)

(72) Inventors: John Joseph Consoli, Harrisburg, PA (US); Chad William Morgan, Carneys Point, NJ (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 16/255,255

(22) Filed: Jan. 23, 2019

(51) Int. Cl.
| | |
|---|---|
| *H01R 12/00* | (2006.01) |
| *H01R 12/73* | (2011.01) |
| *H01R 12/72* | (2011.01) |
| *H01R 13/24* | (2006.01) |
| *H01R 13/453* | (2006.01) |
| *H05K 1/14* | (2006.01) |

(52) U.S. Cl.
CPC ......... *H01R 12/737* (2013.01); *H01R 12/727* (2013.01); *H01R 13/2442* (2013.01); *H01R 13/4534* (2013.01); *H05K 1/14* (2013.01); *H05K 2201/044* (2013.01); *H05K 2201/09063* (2013.01); *H05K 2201/10265* (2013.01); *H05K 2201/10333* (2013.01)

(58) Field of Classification Search
CPC .. H01R 12/737; H01R 12/727; H01R 12/712; H01R 13/2442; H01R 13/4534
USPC .......................................... 439/65, 67, 74, 75
See application file for complete search history.

(56) References Cited

U.S. PATENT DOCUMENTS

| | | | |
|---|---|---|---|
| 3,587,029 A | 6/1971 | Knowles et al. | |
| 4,560,221 A | 12/1985 | Olsson | |
| 5,114,353 A | 5/1992 | Sample | |
| 5,676,559 A | 10/1997 | Laub et al. | |
| 5,780,172 A | 7/1998 | Fister et al. | |
| 5,849,424 A | 12/1998 | Sugawara et al. | |
| 6,207,298 B1 | 3/2001 | Fukui | |
| 6,267,604 B1 | 7/2001 | Mickievicz et al. | |

(Continued)

FOREIGN PATENT DOCUMENTS

| | | |
|---|---|---|
| EP | 2451262 A3 | 3/2013 |
| EP | 2346117 B1 | 3/2014 |

(Continued)

OTHER PUBLICATIONS

International Search Report and Written Opinion for corresponding PCT Application No. PCT/IB2018/051321 dated Jun. 12, 2018 (9 pages).

(Continued)

*Primary Examiner* — Khiem M Nguyen

(57) ABSTRACT

A circuit card assembly includes an electrical connector having a housing mounted to a PCB. The housing has a mounting end and a mating end extending between a front and a rear. The housing has a cavity at the mating end configured to receive a second electrical connector. The housing holds deflectable contacts having spring beams at the mating end having mating interfaces. The circuit card assembly includes a contact actuator in the cavity engaging the spring beams and moving the spring beams between compressed positions and released positions. The mating interfaces of the spring beams are spaced apart from the second electrical connector in the compressed positions and are configured to engage and electrically connect with the second electrical connector in the released positions.

20 Claims, 9 Drawing Sheets

(56) References Cited

U.S. PATENT DOCUMENTS

| | | |
|---|---|---|
| 6,796,822 B2 | 9/2004 | Sato et al. |
| 6,918,775 B2 | 7/2005 | Korsunsky et al. |
| 7,086,866 B1 | 8/2006 | Folan et al. |
| 7,322,834 B2 | 1/2008 | Hu et al. |
| 7,326,092 B2 | 2/2008 | Fedder et al. |
| 7,435,095 B1 | 10/2008 | Yi |
| 7,540,744 B1 | 6/2009 | Minich |
| 7,708,578 B1 | 5/2010 | Lenox |
| 7,771,207 B2 | 8/2010 | Hamner et al. |
| 7,789,667 B2 | 9/2010 | Hamner et al. |
| 7,824,187 B1 | 11/2010 | Yi |
| 7,918,683 B1 | 4/2011 | Hamner et al. |
| 7,988,457 B1 | 8/2011 | Morgan |
| 8,113,851 B2 | 2/2012 | Hamner et al. |
| 8,199,511 B2 | 6/2012 | Kim et al. |
| 8,376,766 B1 | 2/2013 | Huettner et al. |
| 8,512,081 B2 | 8/2013 | Stokoe |
| 8,684,610 B2 | 4/2014 | Nichols |
| 9,551,625 B2 | 1/2017 | Brugger et al. |
| 9,608,371 B2 | 3/2017 | Bonzom et al. |
| 9,608,382 B2 | 3/2017 | McClellan et al. |
| 9,859,640 B1 | 1/2018 | Horning et al. |
| 9,917,406 B1 | 3/2018 | Iwasaki et al. |
| 9,966,163 B2 | 5/2018 | Sawada |
| 2002/0071259 A1 | 6/2002 | Roos |
| 2003/0186597 A1 | 10/2003 | Suzuki et al. |
| 2005/0064733 A1 | 3/2005 | Korsunsky et al. |
| 2005/0070136 A1 | 3/2005 | Korsunsky et al. |
| 2005/0084733 A1 | 4/2005 | Tarver |
| 2005/0181637 A1 | 8/2005 | Williams et al. |
| 2007/0184676 A1 | 8/2007 | Minich |
| 2008/0045087 A1 | 2/2008 | Yi et al. |
| 2014/0065849 A1 | 3/2014 | Kida et al. |
| 2016/0006150 A1 | 1/2016 | Bachmutsky |
| 2018/0040989 A1 | 2/2018 | Chen |
| 2018/0261941 A1 | 9/2018 | Consoli et al. |

FOREIGN PATENT DOCUMENTS

| | | |
|---|---|---|
| JP | 2003044794 A | 2/2003 |
| JP | 2005158337 A | 6/2005 |
| TW | M537321 U | 2/2017 |
| WO | 2007092113 A2 | 8/2007 |
| WO | 2014021219 A1 | 2/2014 |

OTHER PUBLICATIONS

U.S. Appl. No. 15/945,821, filed Apr. 5, 2018, entitled "Circuit Card Assemblies for a Communication System" (48 pages).

U.S. Appl. No. 15/945,802, filed Apr. 5, 2018, entitled "Circuit Card Assemblies for a Communication System" (49 pages).

U.S. Appl. No. 15/945,787, filed Apr. 5, 2018, entitled "Electrical Connector for a Circuit Card Assembly of a Communication System" (54 pages).

U.S. Appl. No. 15/945,767, filed Apr. 5, 2018, entitled "Circuit Card Assemblies for a Communication System" (57 pages).

U.S. Appl. No. 15/945,775, filed Apr. 5, 2018, entitled "Electrical Connector for a Circuit Card Assembly of a Communication System" (61 pages).

U.S. Appl. No. 15/945,812, filed Apr. 5, 2018, entitled "Circuit Card Assemblies for a Communication System" (57 pages).

U.S. Appl. No. 16/145,913, filed Sep. 28, 2018, entitled "Electrical Connector and Connector System Having Plated Ground Shields" (44 pages).

Kerridge "Fast Backplane Connectors Disguise Digital Transmission Lines" EDN Europe Design Feature XP-000724062; 1997 (6 pages).

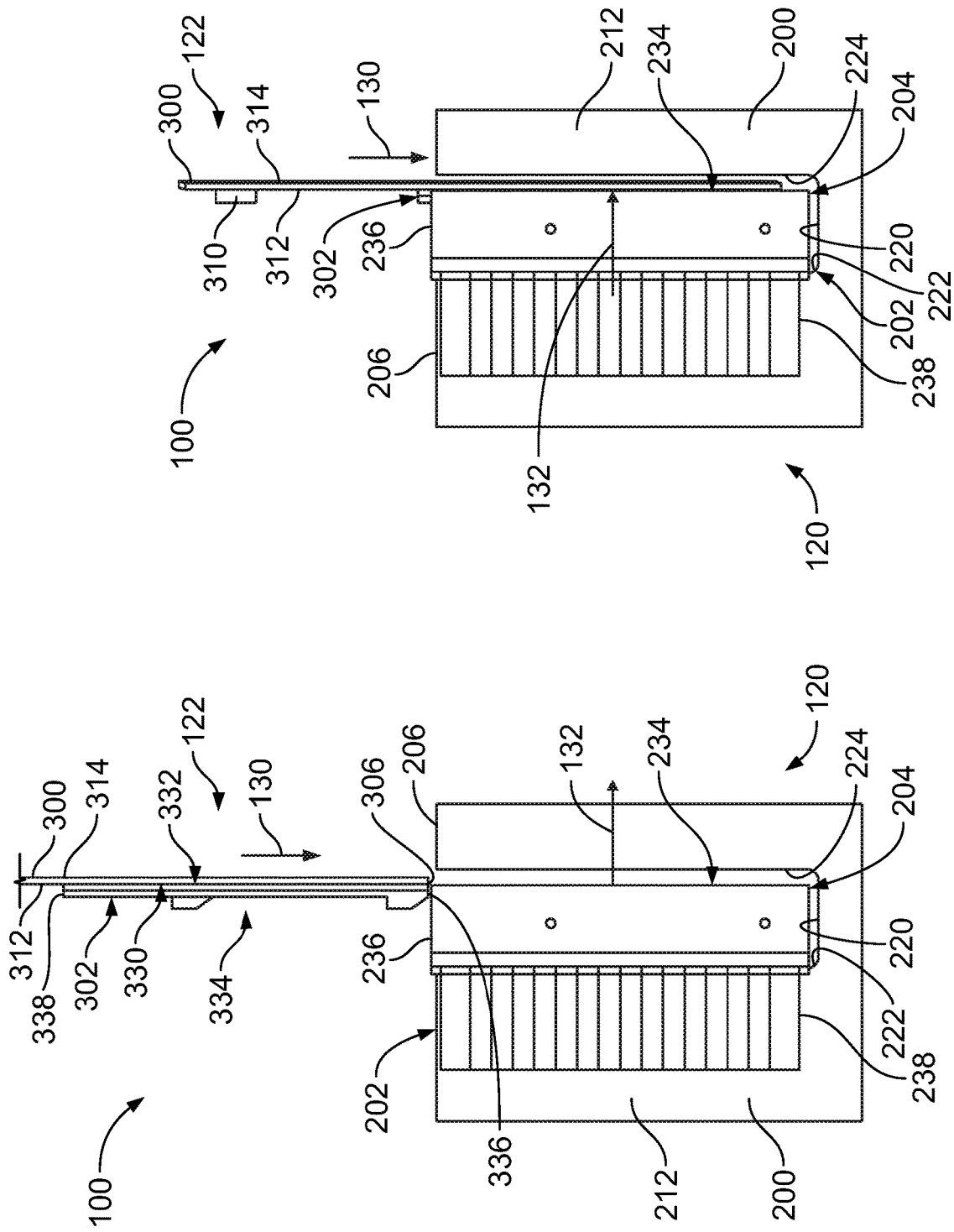

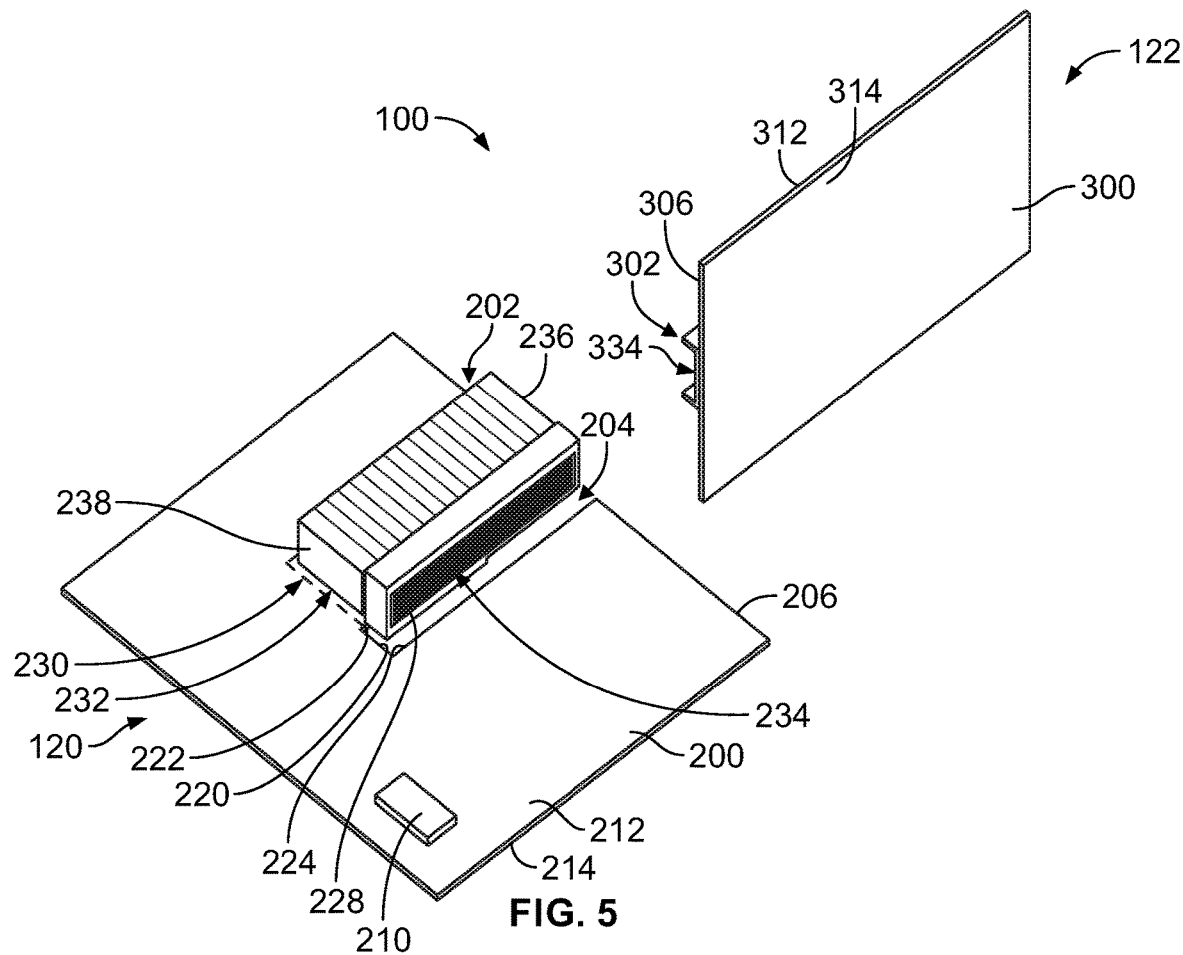
FIG. 5
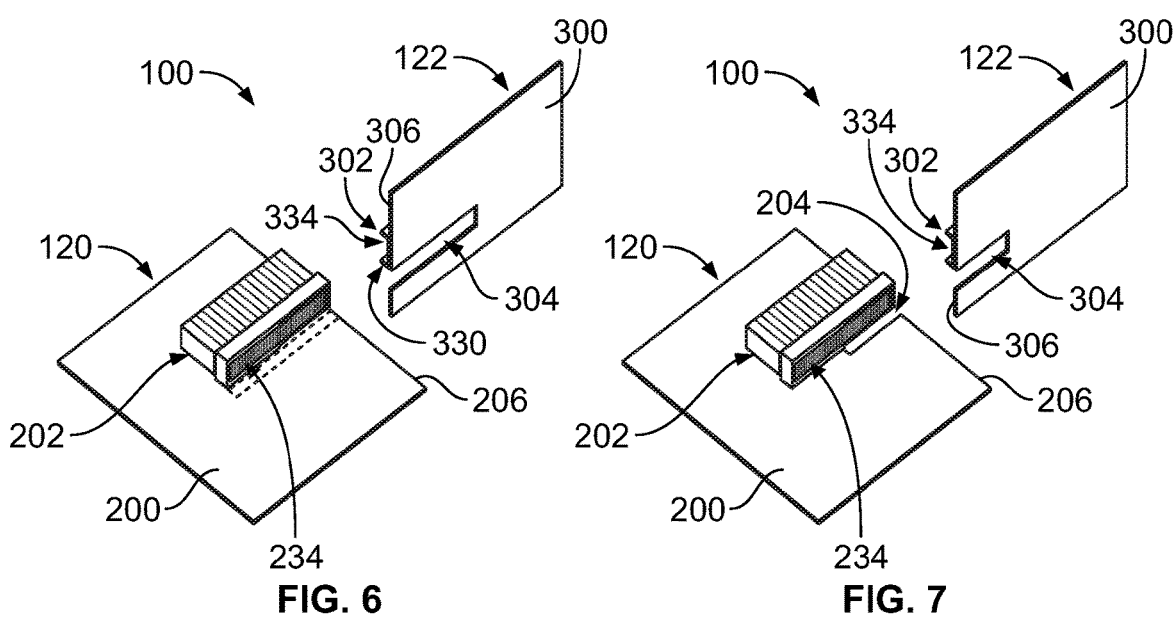
FIG. 6
FIG. 7

CIRCUIT CARD ASSEMBLIES FOR A COMMUNICATION SYSTEM

BACKGROUND OF THE INVENTION

The subject matter herein relates generally to circuit card assemblies for communication systems.

Communication systems are in use in various applications, such as network switches. The communication systems include various circuit cards, such as backplanes and/or daughtercards, which are coupled together to electrically connect various circuits. For example, the circuit cards include electrical connectors that are mated to electrical connectors of one or more other circuit cards. Some communication systems use a backplane or midplane that is perpendicular to the mating direction of the daughtercards. However, such backplanes or midplanes block airflow through the communication system leading to overheating of components or limiting operating speeds to avoid overheating.

Other communication systems arrange both circuit cards parallel to the mating direction to allow airflow through the system. The circuit cards are typically oriented orthogonally to each other (for example, horizontally and vertically). The electrical connectors are provided at edges of both circuit cards and direct mate to each other. Conventional communication systems utilize right angle electrical connectors on both cards that direct mate with each other in an orthogonal orientation. The mating interfaces of the electrical connectors are parallel to the mating edges of the circuit cards such that the electrical connectors are mated in a direction parallel to the mating direction of the circuit cards. However, such right-angle electrical connectors are expensive to manufacture and occupy a large amount of space in the system, thus blocking airflow through the system. Some known communication systems have mating interfaces that are perpendicular to the mating edges of the circuit cards. The mating interfaces may be elongated rearward from the mating edge. However, the contacts of the electrical connectors are susceptible to damage during mating.

A need remains for a cost effective and reliable communication system providing protection to the contacts during mating of the electrical connectors of the communication system.

BRIEF DESCRIPTION OF THE INVENTION

In one embodiment, a circuit card assembly is provided for a communication system including a printed circuit board (PCB) having a first surface and a second surface and a mating edge between the first and second surfaces and a mounting area on the first surface proximate to the mating edge. The circuit card assembly includes an electrical connector mounted to the first surface at the mounting area configured for mating with a second electrical connector. The electrical connector has a housing extending between a front and a rear. The front is provided proximate to the mating edge. The housing has a mating end extending between the front and the rear configured to be mated with a portion of the second electrical connector. The housing holds contacts having terminating ends being electrically connected to the PCB and spring beams at the mating end having mating interfaces. The spring beams are deflectable. The circuit card assembly includes a contact actuator coupled to the housing engaging the spring beams and moving the spring beams between compressed positions and released positions. The mating interfaces of the spring beams are held by the contact actuator spaced apart from the second electrical connector in the compressed positions. The mating interfaces of the spring beams are configured to engage and electrically connect with the second electrical connector in the released positions.

In another embodiment, a circuit card assembly is provided for a communication system including a printed circuit board (PCB) having a first surface and a second surface and a mating edge between the first and second surfaces and a mounting area on the first surface proximate to the mating edge. The circuit card assembly includes an electrical connector mounted to the first surface at the mounting area configured for mating with a second electrical connector. The electrical connector has a housing extending between a front and a rear. The front is provided proximate to the mating edge. The housing has a mating end extending between the front and the rear. The mating end is configured to be mated with the second electrical connector in a loading direction parallel to the first surface. The housing holds contacts having terminating ends being electrically connected to the PCB and spring beams at the mating end. The spring beams have mating interfaces and are deflectable. The circuit card assembly includes a contact actuator coupled to the housing and movable relative to the housing between an advanced position and a retracted position. The contact actuator engages the spring beams and moves the spring beams between compressed positions and released positions as the contact actuator moves between the advanced position and the retracted position. The mating interfaces of the spring beams are held by the contact actuator spaced apart from the second electrical connector in the compressed positions. The mating interfaces of the spring beams are configured to engage and electrically connect with the second electrical connector in the released positions.

In a further embodiment, a communication system is provided including a first circuit card assembly having a first printed circuit board (PCB) and a first electrical connector mounted to the first PCB proximate to a mating edge of the first PCB. The first electrical connector has a first mating end and first contacts at the first mating end each having a first mating interface. The communication system includes a second circuit card assembly having a second PCB and a second electrical connector mounted to the second PCB proximate to a mating edge of the second PCB. The second electrical connector has a second mating end and second contacts at the second mating end. The second electrical connector has a housing holding the second contacts. The housing has a mating end mated with a portion of the second electrical connector in a loading direction. The contacts have spring beams at the mating end having second mating interfaces. The spring beams are deflectable. The second electrical connector has a contact actuator coupled to the housing and movable relative to the housing between an advanced position and a retracted position. The contact actuator engages the spring beams and moves the spring beams between compressed positions and released positions as the contact actuator moves between the advanced position and the retracted position. The second mating interfaces of the spring beams are held by the contact actuator spaced apart from the first contacts in the compressed positions. The second mating interfaces of the spring beams engage and electrically connect with the first mating interfaces of the corresponding first contacts in the released position. At least one of the first PCB and the second PCB includes a slot receiving the other of the first PCB and the second PCB in the loading direction along a loading axis.

BRIEF DESCRIPTION OF THE DRAWINGS

FIG. 3 is a top view of a portion of the communication system showing circuit card assemblies poised for mating in accordance with an exemplary embodiment.

FIG. 4 is a top view of a portion of the communication system showing circuit card assemblies coupled together in accordance with an exemplary embodiment.

FIG. 5 is a perspective view of a portion of the communication system showing circuit card assemblies poised for mating in accordance with an exemplary embodiment.

FIG. 6 is a perspective view of a portion of the communication system in accordance with an exemplary embodiment.

FIG. 7 is a perspective view of a portion of the communication system in accordance with an exemplary embodiment.

DETAILED DESCRIPTION OF THE INVENTION

Figure 1:
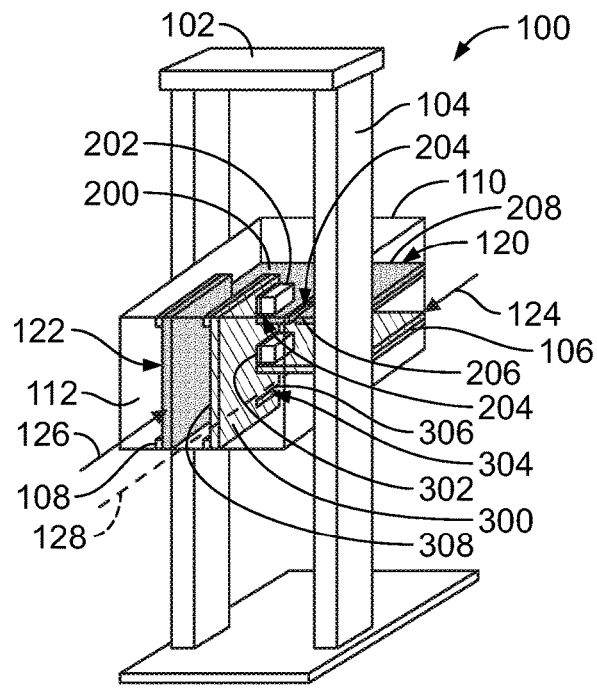
FIG. 1 illustrates a communication system formed in accordance with an exemplary embodiment.

FIG. 1 illustrates a communication system 100 formed in accordance with an exemplary embodiment. The communication system 100 includes a chassis 102 having a frame 104 configured to hold communication components, such as network components, such as circuit card assemblies. Optionally, the chassis 102 may include a cabinet (not shown) surrounding components of the communication system 100. In an exemplary embodiment, the frame 104 includes a plurality of racks 106, 108 for holding circuit card assemblies. For example, the communication system 100 may form part of a data center switch having one or more backplanes and/or daughter cards, such as line cards, switch cards or other types of circuit cards that may be electrically connected together.

In an exemplary embodiment, the communication system 100 includes a front end 110 and a rear end 112. The racks 106 are provided at the front end 110 and the racks 108 are provided at the rear end 112. One or more circuit card assemblies 120 may be received in the racks 106 at the front end 110 and one or more circuit card assemblies 122 may be received in the racks 108 at the rear end 112. The circuit card assemblies 120 may be referred to hereinafter as first circuit card assemblies 120 or front circuit card assemblies to differentiate from the circuit card assemblies 122, which may be referred to hereinafter as second circuit card assemblies 122 and/or rear circuit card assemblies 122. The first circuit card assembly 120 is a mating circuit card assembly for the second circuit card assembly 122. Similarly, the second circuit card assembly 122 is a mating circuit card assembly for the first circuit card assembly 120. In an exemplary embodiment, the circuit card assemblies 120, 122 are orthogonal to each other. For example, in the illustrated embodiment, the front circuit card assemblies 120 are oriented horizontally while the rear circuit card assemblies 122 are oriented vertically; however, other orientations are possible in alternative embodiments.

The front circuit card assemblies 120 are electrically connected to one or more of the rear circuit card assemblies 122. Optionally, the front circuit card assemblies 120 and/or the rear circuit card assemblies 122 may be removable from the corresponding racks 106, 108. The racks 106, 108 guide and position the circuit card assemblies 120, 122, respectively. For example, the racks 106 position the front circuit card assemblies 120 for mating with multiple rear circuit card assemblies 122 and the racks 108 position the rear circuit card assemblies 122 for mating with multiple front circuit card assemblies 120. The front circuit card assemblies 120 may be loaded into the frame 104 through the front end 110 while the rear circuit card assemblies 122 may be loaded into the frame 104 through the rear end 112. For example, the front circuit card assemblies 120 are configured to be loaded into corresponding racks 106 in a loading direction 124 and the rear circuit card assemblies 122 are configured to be loaded into corresponding racks 108 in a loading direction 126. The loading directions 124, 126 may be parallel to a loading axis 128.

The first circuit card assembly 120 includes a first printed circuit board (PCB) 200 and a first electrical connector 202 mounted to the first PCB 200. The first PCB 200 may include any number of the electrical connectors 202, such as one electrical connector 202 for electrically connecting to each corresponding second circuit card assembly 122. Optionally, the first PCB 200 may include one or more first slots 204 for receiving PCBs of corresponding second circuit card assemblies 122 when mated thereto.

Figure 2:
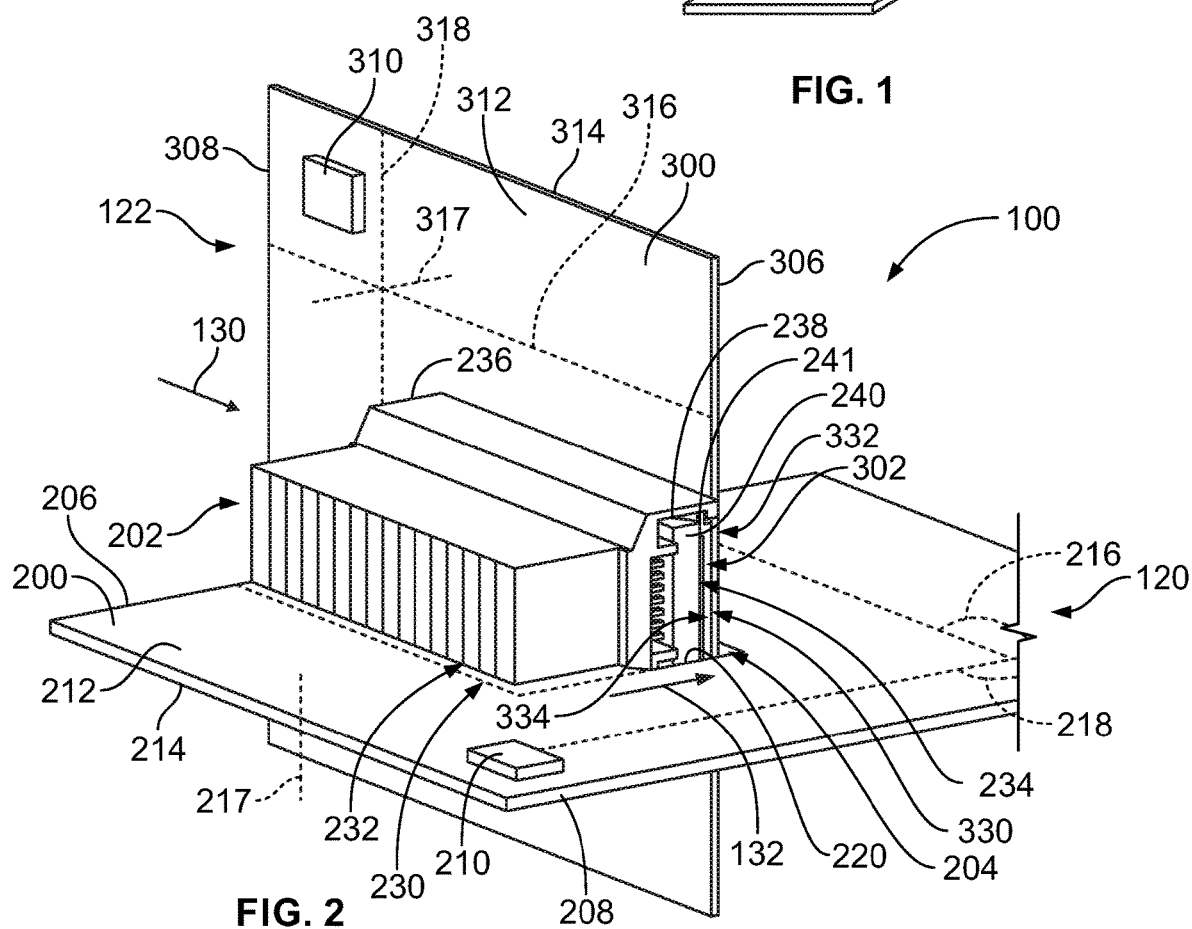
FIG. 2 is a perspective view of a portion of the communication system showing circuit card assemblies in accordance with an exemplary embodiment.

The first PCB 200 extends between a first mating edge 206 at a front of the PCB 200 and a rear edge 208 opposite the mating edge 206. Optionally, the rear edge 208 may include a handle or other feature for insertion and removal of the first circuit card assembly 120. The first PCB 200 may include one or more electrical components 210 (such as shown in FIG. 2) thereon. For example, the electrical components 210 may be processors, memory modules, batteries, fans, signal processing devices, and the like.

The second circuit card assembly 122 includes a second PCB 300 and a second electrical connector 302 mounted to the second PCB 300. The second PCB 300 may include any number of the electrical connectors 302, such as one electrical connector 302 for electrically connecting to each corresponding first circuit card assembly 120. The second PCB 300 extends between a second mating edge 306 at a front of the PCB 300 and a rear edge 308 opposite the mating edge 306. The first and second mating edges 206, 306 of the first and second PCBs 200, 300 interface with each other when the first and second circuit card assemblies 120, 122 are mated. For example, the fronts of the PCBs 200, 300 face each other and the rear edges 208, 308 face away from each other. Optionally, the rear edge 308 may include a handle or other feature for insertion and removal of the second circuit card assembly 122. The second PCB 300 may include one or more electrical components 310 (such as shown in FIG. 2) thereon. For example, the electrical components 310 may be processors, memory modules, batteries, fans, signal processing devices, and the like.

Optionally, the second PCB 300 may include one or more second slots 304 for receiving first PCBs 200 of corresponding first circuit card assemblies 120 when mated thereto. In various embodiments, both PCBs 200, 300 include the first and second slots 204, 304. In other various embodiments, only the first PCB 200 includes the first slots 204, whereas in other various embodiments, only the second PCB 300 includes the second slots 304.

The first slots 204 and/or the second slots 304 allow the first and second PCBs 200, 300 to be internested and overlapping such that the first and second electrical connectors 202, 302 are aligned for mating. For example, the first slots 204 and/or the second slots 304 allow the first and second PCBs 200, 300 to overlap to align mating ends of the first and second electrical connectors 202, 302 for mating. The arrangement allows the mating interfaces of the first and second electrical connectors 202, 302 to be elongated in a direction extending away from the mating edges 206, 306, thus providing high contact density. The arrangement allows the first and second electrical connectors 202, 302 to be mated in a mating direction perpendicular to the loading directions 124, 126. In various embodiments, the first and second PCBs 200, 300 and the first and second electrical connectors 202, 302 may be loaded or mated together in a loading direction 130 (FIG. 2) and at the end of the mating process the first and second electrical connectors 202, 302 may be mated in a connector mating direction 132 (FIG. 2) perpendicular to the loading direction 130. In other various embodiments, the first and second PCBs 200, 300 and the first and second electrical connectors 202, 302 may be mated together in a mating direction parallel to the loading direction 130 (FIG. 2).

Having the first and second circuit card assemblies 120, 122 inter-nested and overlapped using the slot(s) 204, 304 allows the first and second electrical connectors 202, 302 to be elongated along the PCBs 200, 300 reducing one or more other dimensions of the electrical connectors 202, 302 (for example, a height and/or a width) allowing a greater amount of airflow through the communication system 100 (for example, from the front end 110 to the rear end 112 and/or from the rear end 112 to the front end 110). The arrangement may allow the PCBs 200, 300 to overlap to reduce one or more dimensions of the communication system 100, such as a front to rear length of the communication system 100. The first electrical connector 202 is a mating electrical connector for the second electrical connector 302. Similarly, the second electrical connector 302 is a mating electrical connector for the first electrical connector 202. The first PCB 200 is a mating PCB for the second circuit card assembly 122. Similarly, the second PCB 300 is a mating PCB for the first circuit card assembly 120.

In an exemplary embodiment, the second circuit card assembly 122 includes a protection device 400 (shown in FIG. 10) for protecting the contacts of the second electrical connectors 302 during loading or positioning of the first and second electrical connectors 202, 302 relative to each other. The protection device 400 may guard or cover the contacts and limit engagement of the contacts with the first electrical connector 202 during loading. For example, the protection device 400 is a contact actuator in various embodiments, the actuates or moves the contacts away from the first electrical connector 202 until the first and second electrical connectors 202, 302 are appropriately positioned. The contacts may then be released by the contact actuator to mate with the first electrical connector 202. Other types of protection devices may be used in other various embodiments.

FIG. 2 is a perspective view of a portion of the communication system 100 showing the first circuit card assembly 120 coupled to the second circuit card assembly 122; however, it is noted that the first circuit card assembly 120 may be designed to be coupled to multiple circuit card assemblies 122 and/or the second circuit card assembly 122 may be designed to be coupled to multiple circuit card assemblies 120, such as in the arrangement illustrated in FIG. 1. FIG. 3 is a top view of a portion of the communication system 100 showing the first circuit card assembly 120 poised for mating to the second circuit card assembly 122. FIG. 4 is a top view of a portion of the communication system 100 showing the first circuit card assembly 120 coupled to the second circuit card assembly 122. FIG. 5 is a perspective view of a portion of the communication system 100 showing the first circuit card assembly 120 and the second circuit card assembly 122 poised for mating.

The terms "first", "second", etc. are used merely as labels to generally identify components of the first circuit card assembly 120 or the second circuit card assembly 122, respectively; however, such labels are not used exclusively with the circuit card assemblies 120, 122. Either or both of the circuit card assemblies 120, 122 may include any of the various components or elements described herein and some components may only be described with respect to either the circuit card assembly 120 or the circuit card assembly 122; however, the other of the circuit card assembly 120 or the circuit card assembly 122 may additionally include such components. Furthermore, the components may be described herein with or without the "first" label or the "second" label.

The first circuit card assembly 120 includes the first PCB 200 having the first slot 204 and the electrical connector 202 mounted to the PCB 200 proximate to the first slot 204. The first circuit card assembly 120 may include one or more of the electrical components 210. The PCB 200 includes a first surface 212 and a second surface 214 being the main surfaces of the PCB 200. In the illustrated embodiment, the first surface 212 is an upper surface and the second surface 214 is a lower surface; however, the PCB 200 may have other orientations in alternative embodiments. The first and second surfaces 212, 214 extend along a primary axis 216 and a secondary axis 218 perpendicular to the primary axis 216. The PCB 200 has a thickness between the first and second surfaces 212, 214 along a transverse axis 217 perpendicular to the primary and secondary axes 216, 218. In an exemplary embodiment, the primary and secondary axes 216, 218 are in a horizontal plane and the transverse axis 217 extends in a vertical direction; however, the PCB 200 may have other orientations in alternative embodiments. In an exemplary embodiment, the primary axis 216 extends between the mating edge 206 and the rear edge 208 (shown in FIG. 1). In an exemplary embodiment, the secondary axis 218 is parallel to the mating edge 206.

The first slot 204 extends entirely through the PCB 200 between the first and second surfaces 212, 214. The first slot 204 is open at the mating edge 206 to receive the second circuit card assembly 122. The first slot 204 extends a length along the primary axis 216 to an end edge 220 remote from the mating edge 206. The first slot 204 has first and second side edges 222, 224 extending between the mating edge 206 and the end edge 220. Optionally, the side edges 222, 224 may be generally parallel to each other. Alternatively, the side edges 222, 224 may be nonparallel, such as to taper the first slot 204. For example, the first slot 204 may be wider near the mating edge 206 and narrower near the end edge 220. Optionally, the side edges 222, 224 may have chamfered lead-ins at the mating edge 206 to guide the second circuit card assembly 122 into the first slot 204.

The first PCB 200 includes a mounting area 230 for the electrical connector 202 on the first surface 212. The mounting area 230 is adjacent the first slot 204. For example, the mounting area 230 extends along the mating edge 206 a distance from the first slot 204 and extends along the first side edge 222 of the first slot 204 a distance from the mating edge 206. Optionally, the mounting area 230 may extend beyond the end edge 220 of the first slot 204. The electrical connector 202 is terminated to the PCB 200 at the mounting area 230. For example, contacts 228 of the electrical connector 202 may be soldered to the PCB 200 at the mounting area 230. The mounting area 230 may include plated vias that receive compliant pins or solder tails of the contacts 228 of the electrical connector 202 for termination of the contacts 228 to the PCB 200. Optionally, at least a portion of the electrical connector 202 may extend beyond the first side edge 222 over the first slot 204 and/or at least a portion of the electrical connector 202 may extend forward of the mating edge 206 and/or at least a portion of the electrical connector 202 may extend rearward of the end edge 220. In other various embodiments, the PCB 200 may include more than one mounting area 230 adjacent the first slot 204 for receiving additional electrical connectors 202. For example, multiple electrical connectors 202 may be electrically connected to the same circuit card assembly 122. For example, additional electrical connectors 202 may be provided on both sides of the first slot 204 and/or both sides of the PCB 200.

The first electrical connector 202 is mounted to the PCB 200 at the mounting area 230. In the illustrated embodiment, the electrical connector 202 is a right-angle connector having a mounting end 232 perpendicular to a mating end 234. For example, the mounting end 232 may be provided at a bottom of the electrical connector 202 and the mating end 234 may be provided at a side of the electrical connector 202. The electrical connector 202 extends between a front 236 and a rear 238 opposite the front 236. The mounting end 232 extends between the front 236 and the rear 238 at the bottom of the electrical connector 202. The mounting end 232 is mounted to the PCB 200. For example, the electrical connector 202 is mechanically and electrically terminated to the PCB 200 at the mounting end 232. The mating end 234 extends between the front 236 and the rear 238. In the illustrated embodiment, the mating end 234 generally faces the first slot 204 for interfacing with the second electrical connector 302 when the second circuit card assembly 122 is received in the first slot 204. The mating end 234 is configured to be mated to the mating electrical connector defined by the second electrical connector 302 when the second circuit card assembly 122 is received in the first slot 204.

In an exemplary embodiment, the mating end 234 is oriented generally vertically along the transverse axis 217 and extends parallel to the primary axis 216. The mating end 234 faces sideways rather than forward. For example, the mating end 234 is perpendicular to the mating edge 206 of the PCB 200. The front 236 is oriented generally vertically along the transverse axis 217 and extends parallel to the secondary axis 218. The front 236 may be positioned a first distance from the mating edge 206 (either forward of, rearward of or flush with the mating edge 206) and the rear 238 is positioned a second distance from the mating edge 206 greater than the first distance. The mating end 234 spans a majority of the distance between the front 236 and the rear 238. The front 236 is forward facing and, in the illustrated embodiment, is provided near the mating edge 206, such as generally flush with the mating edge 206.

The second circuit card assembly 122 includes the second PCB 300, which may or may not include a slot. In the illustrated embodiment, the PCB 300 does not include a slot. The PCB 300 includes a first surface 312 and a second surface 314 being the main surfaces of the PCB 300. The second circuit card assembly 122 may include one or more of the electrical components 310. In the illustrated embodiment, the first surface 312 defines a first side and the second surface 314 defines a second side of the PCB 300; however, the PCB 300 may have other orientations in alternative embodiments. The first and second surfaces 312, 314 extend along a primary axis 316 and a secondary axis 318 perpendicular to the primary axis 316. The PCB 300 has a thickness between the first and second surfaces 312, 314 along a transverse axis 317 perpendicular to the primary and secondary axes 316, 318. In an exemplary embodiment, the primary and secondary axes 316, 318 are in a vertical plane and the transverse axis 317 extends in a horizontal direction; however, the PCB 300 may have other orientations in alternative embodiments. In an exemplary embodiment, the primary axis 316 extends between the mating edge 306 and the rear edge 308 (shown in FIG. 2). In an exemplary embodiment, the secondary axis 318 is parallel to the mating edge 306.

In an exemplary embodiment, at least a portion of the PCB 300 is configured to be received in the first slot 204 and may at least partially fill the first slot 204. Such portion may engage the end edge 220, the first side edge 222 and/or the second side edge 224 of the first slot 204 when received therein.

The second PCB 300 includes a mounting area 330 for the electrical connector 302 on the first surface 312. The mounting area 330 extends from the mating edge 306 a distance. The electrical connector 302 is terminated to the PCB 300 at the mounting area 330. For example, contacts 328 (shown in FIG. 10) of the electrical connector 302 may be soldered to the PCB 300 at the mounting area 330. The mounting area 330 may include plated vias that receive compliant pins or solder tails of the contacts 328 of the electrical connector 302 for termination of the contacts 328 to the PCB 300. Optionally, at least a portion of the electrical connector 302 may extend forward of the mating edge 306. In other various embodiments, the PCB 300 may include more than one mounting area 330 for receiving additional electrical connectors 302. For example, multiple electrical connectors 302 may be electrically connected to the same circuit card assembly 122.

The second electrical connector 302 is mounted to the PCB 300 at the mounting area 330. In the illustrated embodiment, the electrical connector 302 is a header connector having a mounting end 332 parallel to a mating end 334. For example, the mounting end 332 may be provided along one side of the electrical connector 302 and the mating end 334 may be provided at the opposite side of the electrical connector 302. Optionally, the mounting end 332 and the mating end 334 may be parallel to each other and non-coplanar. The electrical connector 302 extends between a front 336 (FIG. 3) and a rear 338 (FIG. 3) opposite the front 336. The mounting end 332 and the mating end 334 both extend between the front 336 and the rear 338. The mounting end 332 is mounted to the PCB 300. For example, the electrical connector 302 is mechanically and electrically terminated to the PCB 300 at the mounting end 332. In the illustrated embodiment, the mating end 334 is oriented for interfacing with the first electrical connector 202 when the second circuit card assembly 122 is received in the first slot 204.

In an exemplary embodiment, the mating end 334 is oriented generally vertically and extends parallel to the primary axis 316. The mating end 334 faces sideways rather than forward. For example, the mating end 334 is perpendicular to the mating edge 306 of the PCB 300. The front 336 is oriented generally vertically and extends parallel to the secondary axis 318. The front 336 may be positioned a first distance from the mating edge 306 (either forward of, rearward of or flush with the mating edge 306) and the rear 338 is positioned a second distance from the mating edge 306 greater than the first distance. The mating end 334 spans a majority of the distance between the front 336 and the rear 338. The front 336 is forward facing and, in the illustrated embodiment, is provided near the mating edge 306, such as generally flush with the mating edge 306.

When the first and second circuit card assemblies 120, 122 are mated, the first and second PCBs 200, 300 are internested and the second PCB 300 is received in the first slot 204. When mated, the first PCB 200 at least partially overlaps with the second PCB 300 to align the mating ends 234, 334 of the electrical connectors 202, 302. For example, the mating edges 206, 306 bypass each other as the second PCB 300 is received in the first slot 204. During mating, the contacts 328 are moved in a loading direction 130 (for example, parallel to the primary axis 316 of the PCB 300). The protection device 400 (shown in FIG. 10) of the second electrical connector 302 protects the contacts 328 during bypassing of the first and second electrical connectors 202, 302, such as to prevent the mating interfaces of the second contacts 328 from wiping along the first contacts 228 and/or inadvertently being electrically connected to incorrect first contacts 228 as the second contacts 328 move past various first contacts 228 until being aligned with the corresponding first contacts 228. In various embodiments, the first contacts 228 and/or the second contacts 328 may be moved in a mating direction 132 (for example, sideways or perpendicular to the loading direction 130) as the first and second electrical connectors 202, 302 are mated. For example, a portion of the first electrical connector 202 is moved toward the second electrical connector 302 to move the first contacts 228 toward the second contacts 328 during mating. Optionally, the protection device 400 may release the second contacts 328 and allow the second contacts 328 to move toward the first contacts 228 during mating.

FIG. 6 is a perspective view of a portion of the communication system 100 in accordance with an exemplary embodiment. FIG. 6 shows the second circuit card assembly 122 with the second slot 304 and the first circuit card assembly 120 without the first slot 204 (shown in FIG. 5). Optionally, at least a portion of the first PCB 200 is configured to at least partially fill the second slot 304. The second electrical connector 302 is mounted to the mounting area 330 adjacent the second slot 304. When the first and second circuit card assemblies 120, 122 are mated, the first and second PCBs 200, 300 are internested with the first PCB 200 being received in the second slot 304. When mated, the first PCB 200 at least partially overlaps with the second PCB 300 to align the mating ends 234, 334 of the electrical connectors 202, 302. For example, the mating edges 206, 306 bypass each other as the first PCB 200 is received in the second slot 304.

FIG. 7 is a perspective view of a portion of the communication system 100 in accordance with an exemplary embodiment. FIG. 7 shows the first circuit card assembly 120 with the first slot 204 and the second circuit card assembly 122 with the second slot 304. When the first and second circuit card assemblies 120, 122 are mated, the first and second PCBs 200, 300 are internested with the first PCB 200 being received in the second slot 304 and with the second PCB 300 being received in the first slot 204. When mated, the first PCB 200 at least partially overlaps with the second PCB 300 to align the mating ends 234, 334 of the electrical connectors 202, 302. For example, the mating edges 206, 306 bypass each other as the PCBs 200, 300 are received in the second and first slots 304, 204, respectively.

Figure 8:
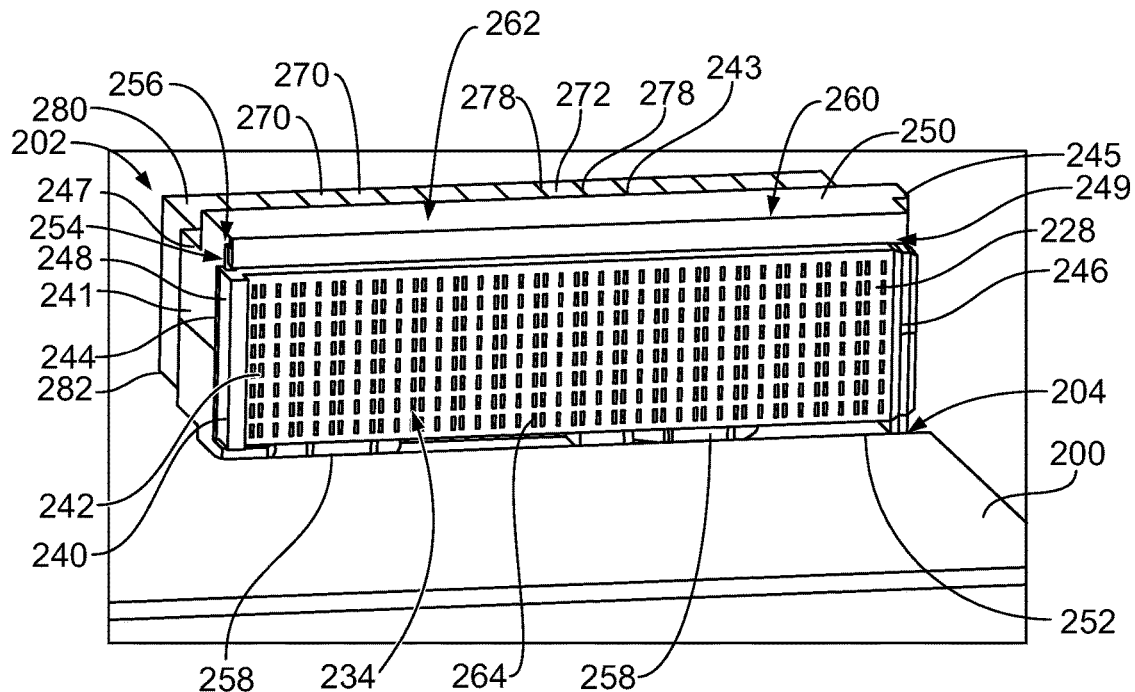
FIG. 8 is a side perspective view of an electrical connector of the circuit card assembly in accordance with an exemplary embodiment.
Figure 9:
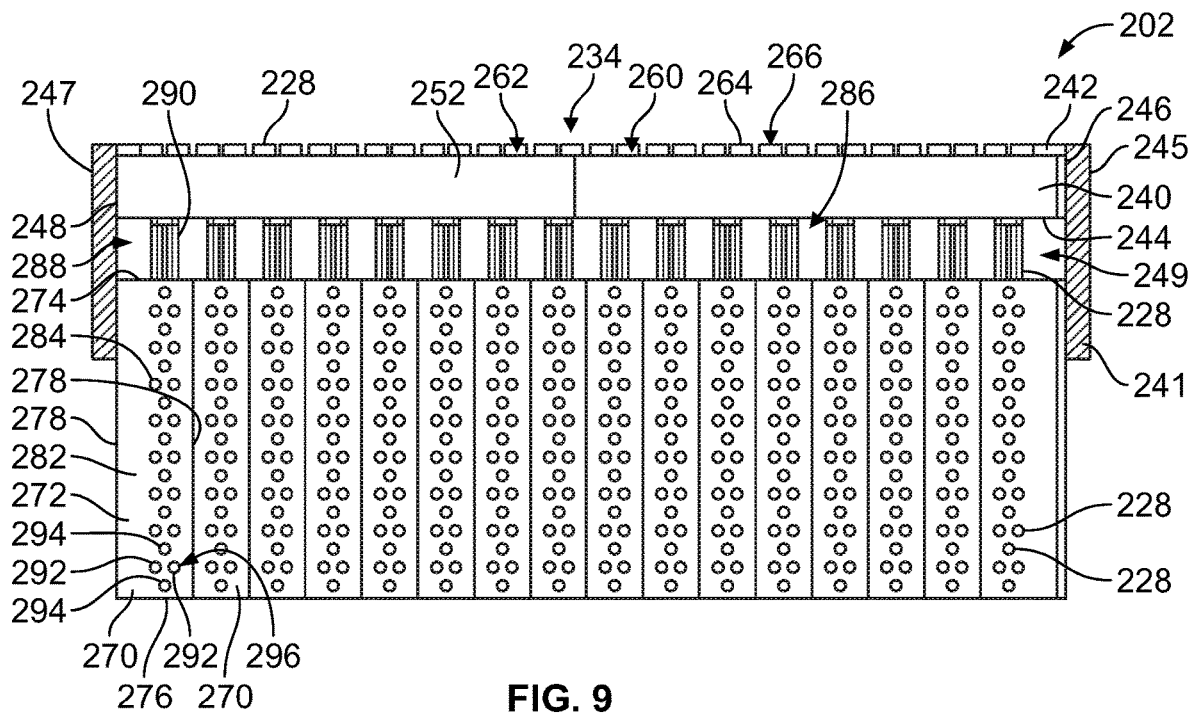
FIG. 9 is a bottom view of the electrical connector shown in FIG. 8 in accordance with an exemplary embodiment.

FIG. 8 is a side perspective view of the first electrical connector 202 in accordance with an exemplary embodiment. FIG. 9 is a bottom view of the first electrical connector 202 in accordance with an exemplary embodiment. In an exemplary embodiment, the first electrical connector 202 includes a mating housing 240 at the mating end 234 and a receptacle housing 241 surrounding at least a portion of the mating housing 240. The mating housing 240 can be movable within the receptacle housing 241, such as in the connector mating direction 132. Such movement allows mating of the first contacts 228 with the second contacts 328 of the second electrical connector 302. In other various embodiments, the first electrical connector 202 may be provided without the receptacle housing 241.

The mating housing 240 includes a first side 242, a second side 244, a front 246 and a rear 248. The first side 242 defines the mating end 234 of the electrical connector 202. The mating end 234 is oriented perpendicular to the first PCB 200. In an exemplary embodiment, the mating housing 240 holds the contacts 228 for mating with the second electrical connector 302 (shown in FIG. 2). For example, each of the contacts 228 includes a mating end 264. The mating ends 264 are provided at the first side 242 in a predetermined layout for mating with the second electrical connector 302. The mating ends 264 have mating interfaces 266 configured to engage the mating contact 328 when mated thereto. In various embodiments, the mating end 264 is defined by a contact pad; however, other types of mating interfaces may be provided in alternative embodiments, such as pins, posts, blades, sockets, spring beams, and the like.

The receptacle housing 241 includes end walls 243 extending between a front wall 245 and a rear wall 247. The walls 243, 245, 247 define a cavity 249 that receives the mating housing 240. In an exemplary embodiment, the end walls 243 are provided at a top 250 and a bottom 252 of the first electrical connector 202. In an exemplary embodiment, the first electrical connector 202 include connecting elements 254 (FIG. 8) at the top 250 and the bottom 252 for connecting the first electrical connector 202 to the second electrical connector 302. In the illustrated embodiment, the connecting elements 254 are defined by grooves 256 in the receptacle housing 241 at the top 250 and the bottom 252 configured to receive portions of the second electrical connector 302. The connecting elements 254 secure the receptacle housing 241 to the second electrical connector 302 as the electrical connectors 202, 302 are coupled together (for example, as the PCBs 200, 300 are moved in the loading direction). Other types of connecting elements 254 may be provided in alternative embodiments, such as pins, clips, fasteners, and the like.

In an exemplary embodiment, the electrical connector 202 includes drive members 258 at the top 250 and the bottom 252 for actuating the mating housing 240 relative to the receptacle housing 241 during mating. The drive members 258 may be positioned in the cavity 249, such as at the end wall(s) 243 at the top 250 and/or at the bottom 252. The drive members 258 are operably coupled to the receptacle housing 241 and operably coupled to the mating housing 240. As the drive members 258 are operated, the drive members 258 move the mating housing 240 sideways relative to the receptacle housing 241 in the connector mating direction 132. In an exemplary embodiment, the drive members 258 may be actuated by engagement with the second electrical connector 302 as the first and second electrical connectors 302 are coupled together. For example, actuators, such as ramps, may be provided on the second electrical connector 302 to actuate the drive members 258 as the drive members engage the actuators. In an exemplary embodiment, multiple drive members 258 are provided, such as at a front section 260 and a rear section 262 of the electrical connector 202. More than two drive members 258 may be provided along either or both sides of the electrical connector 202. In an exemplary embodiment, the drive members 258 are cam levers. However, other types of drive members 258 may be provided in alternative embodiments, such as cam pins configured to be received in cam sockets, pinions configured to engage a rack, a crank configured to engage a rack, a crank configured to engage an idler gear, one or more linkages configured to engage an actuator, and the like.

In an exemplary embodiment, the electrical connector 202 includes contact modules 270 each holding a plurality of the contacts 228. The contact modules 270 may be coupled to the receptacle housing 241 and/or the mating housing 240, such as at the second side 244. For example, in the illustrated embodiment, the contact modules 270 are loaded into the receptacle housing 241 behind the mating housing 240. In an exemplary embodiment, each contact module 270 includes a dielectric body 272 holding corresponding contacts 228. For example, the dielectric body 272 may be overmolded around portions of the contacts 228. Optionally, the contact modules 270 may include ground shields (not shown) to provide electrical shielding for the contacts 228.

The contact modules 270 each have a first side 274 facing the mating housing 240 and a second side 276 opposite the first side 274. The contact module 270 includes sides 278 facing each other when the contact modules 270 are stacked front to rear within the electrical connector 202. Any number of the contact modules 270 may be stacked together depending on the particular application. The number of contacts 228 within the electrical connector 202 may be increased or decreased by changing the number of contact modules 270 rather than retooling to increase the number of contacts per contact module, as is common in conventional systems, such retooling being expensive. The contact module 270 includes a top 280 and a bottom 282. The bottom 282 is configured to be mounted to the first PCB 200 (FIG. 8). Optionally, portions of the contacts 228 may extend below the bottom 282 for termination to the first PCB 200. For example, each of the contacts 228 may include a terminating end 284 (FIG. 9) configured to be terminated to the first PCB 200. For example, the terminating end 284 may be a compliant pin, such as an eye of the needle pin, configured to be press-fit into plated vias in the first PCB 200. In other various embodiments, the terminating end 284 may be a solder tail or another type of terminating end.

In an exemplary embodiment, the electrical connector 202 includes a compliant section 286 between the contact modules 270 and the mating housing 240 that allows the mating housing 240 to shift relative to the contact modules 270, such as during mating with the second electrical connector 302. For example, the contact modules 270 may not engage the mating housing 240 in various embodiments. Rather, a gap 288 may be provided between the first sides 274 of the contact modules 270 and the second side 244 of the mating housing 240. The contacts 228 may span the gap 288 between the contact modules 270 and the mating housing 240. The contacts 228 include flexible sections 290 between the mating ends 264 and the terminating ends 284 to allow relative movement of the contacts 228 and the mating housing 240. The flexible sections 290 may be defined by sections of the contacts 228 that are not encased or enclosed by the dielectric body 272 and/or do not extend through the mating housing 240. For example, the flexible sections 290 may be located in the gap 288.

In an exemplary embodiment, the contacts 228 include signal contacts 292 and ground contacts 294. Optionally, the signal contacts 292 may be arranged in pairs 296 configured to convey differential signals. The ground contacts 294 are interspersed with the signal contacts 292 to provide electrical shielding for the signal contacts 292. For example, the ground contacts 294 may be provided between the pairs 296 of signal contacts 292. Optionally, the ground contacts 294 may be provided above, below, and/or between the various pairs 296 of signal contacts 292. The signal contacts 292 and/or the ground contacts 294 may be stamped and formed contacts.

As shown in FIG. 8, the bottoms 282 of the contact modules 270 are mounted to the PCB 200. In an exemplary embodiment, the mating housing 240 is positioned above the first slot 204 for mating with the second electrical connector 302 (shown in FIG. 2). In an exemplary embodiment, the mating housing 240 is movable relative to the PCB 200 and the contact modules 270, which are fixed to the PCB 200. For example, the flexible sections 290 of the contacts 228 defining the compliant section 286 of the electrical connector 202 allow the mating housing 240 to move relative to the PCB 200 during mating with the second electrical connector 302.

Figure 10:
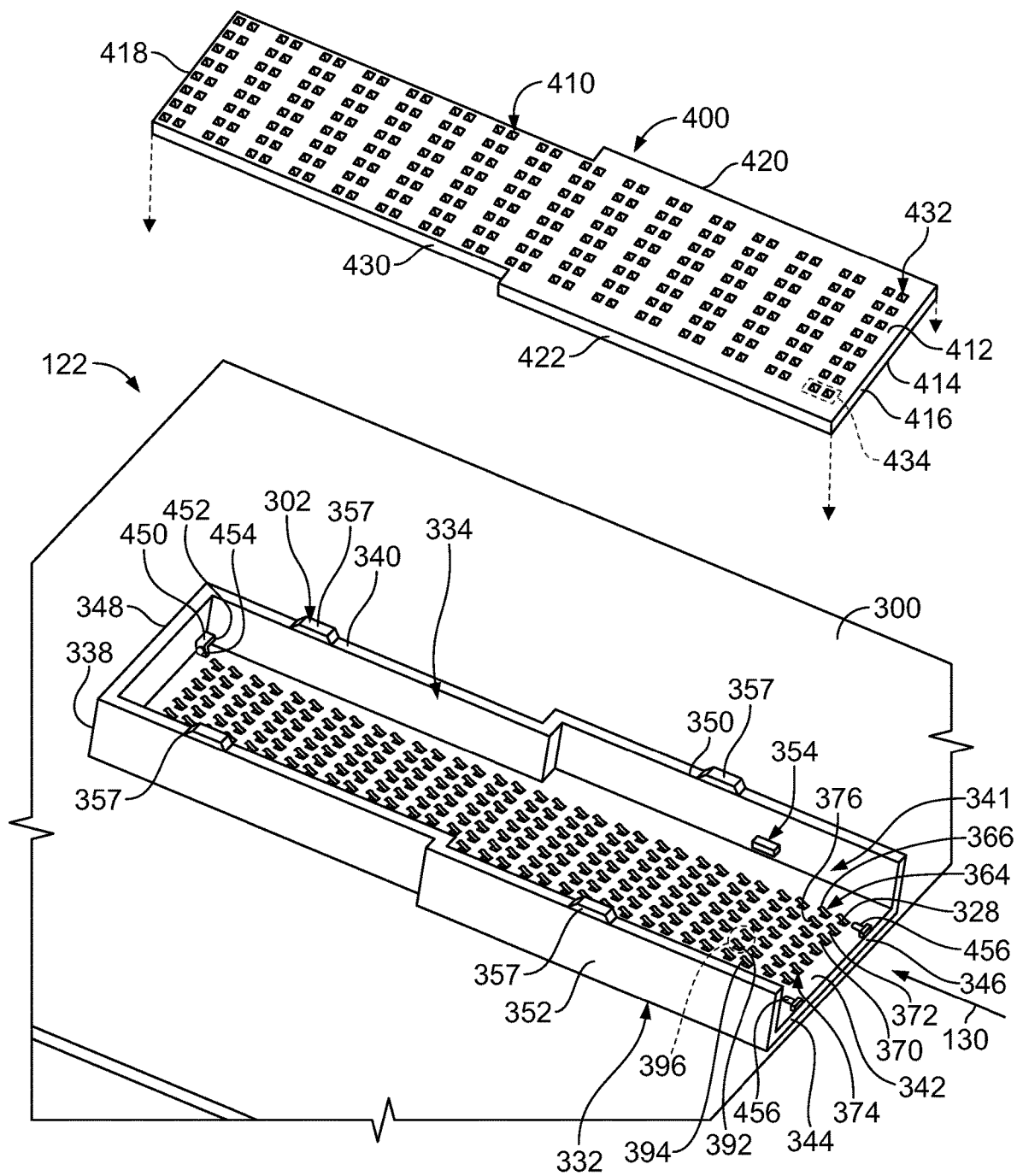
FIG. 10 is an exploded perspective view of a circuit card assembly in accordance with an exemplary embodiment.

FIG. 10 is an exploded perspective view of the second circuit card assembly 122 in accordance with an exemplary embodiment. In an exemplary embodiment, the electrical connector 302 includes a header housing 340 holding the contacts 328 and the protection device 400 for the contacts 328. The header housing 340 includes walls defining a cavity 341 configured to receive the mating housing 240 of the first electrical connector 202 (both shown in FIG. 8) and the protection device 400. In an exemplary embodiment, the protection device 400 includes a contact actuator 410 for protecting the second contacts 328 during mating with the first electrical connector 202. While the contact actuator 410 is illustrated and described as being part of the second circuit card assembly 122, it is realized that the contact actuator 410 may alternatively be provided as part of the first circuit card assembly 120.

The header housing 340 includes a first side 342, a second side 344, a front 346 and a rear 348. The first side 342 faces the mating end 334 of the electrical connector 302. The first side 342 is oriented parallel to the second PCB 300. In an exemplary embodiment, the header housing 340 holds the contacts 328 for mating with the first electrical connector 202. For example, each of the contacts 328 includes a mating end 364 exposed at or beyond the first side 342 for mating with the first electrical connector 202. In an exemplary embodiment, each contact 328 includes a spring beam 370 at the mating end 364 configured to be deflected and spring biased against the corresponding contact 228 of the first electrical connector 202. The mating ends 364 are provided at the first side 342 in a predetermined layout for mating with the first electrical connector 202. The mating ends 364 have mating interfaces 366 proximate to distal ends of the spring beams 370 for electrical connection with the first contacts 228.

The header housing 340 includes a top 350 and a bottom 352. In an exemplary embodiment, the top 350 and the bottom 352 include connecting elements 354 for connecting the second electrical connector 302 to the first electrical connector 202. In the illustrated embodiment, the connecting elements 354 include flanges at the top 350 and the bottom 352 configured to be received in the grooves or slots in the corresponding connecting elements 254 (shown in FIG. 8) of the receptacle housing 241 of the first electrical connector 202. Other types of connecting elements 354 may be provided in alternative embodiments, such as pins, pockets, grooves, clips, fasteners, cams, and the like.

The header housing 340 includes actuators 357 at the first side 342 configured to actuate the drive members 258 (shown in FIG. 8). In the illustrated embodiment, the actuators 357 include ramp surfaces that engage the drive members 258 and actuate the drive members 258 as the drive members 258 ride along the header housing 340 during mating of the first and second electrical connectors 202, 302 in the loading direction 130 (the first electrical connector 202 may be moved/loaded and/or the second electrical connector 302 may be moved/loaded to achieve the relative movement between the electrical connectors 202, 302 in the loading direction 130).

The header housing 340 defines the mounting end 332 of the electrical connector 302 configured to be mounted to the PCB 300. Optionally, portions of the contacts 328 may extend beyond the mounting end 332 for termination to the PCB 300. For example, the contacts 328 may include terminating ends (not shown), such as compliant pins, solder tails, and the like, configured to be terminated to the PCB 300.

In an exemplary embodiment, the contacts 328 include signal contacts 392 and ground contacts 394. Optionally, the signal contacts 392 may be arranged in pairs 396 configured to convey differential signals (differential pairs of signal contacts); however, the signal contacts 392 may convey single-ended signals rather than differential signals. The ground contacts 394 are interspersed with the signal contacts 392 to provide electrical shielding for the signal contacts 392. For example, the ground contacts 394 may be provided between the pairs 396 of signal contacts 392.

In an exemplary embodiment, each contact 328 includes a base 372 mounted to the header housing 340. The spring beam 370 extends from the base 372. Optionally, the spring beam 370 may be bifurcated having multiple spring beam portions that are independently deflectable. The spring beam 370 includes a curved folded portion 374, which may be flexed during mating with the first contacts 228. In an exemplary embodiment, the contact actuator 410 flexes or compresses the spring beam 370 at the folded portion 374. The spring beam 370 extends to a tip 376. The mating interface 366 is located proximate to the tip 376. Optionally, the spring beam 370 is curved between the mating interface 366 and the tip 376. The contact may have other shapes and features in alternative embodiments. In some alternative embodiments, the contacts 328 may be pads rather than deflectable spring beams.

The contact actuator 410 is coupled to the header housing 340. For example, the contact actuator 410 is received in the cavity 341. In an exemplary embodiment, the contact actuator 410 is movable within the cavity 341, such as movable between an advanced position and a retracted position. The contact actuator 410 is movable to cover and expose the contacts 328, such as to protect the contacts 328 during loading of the first electrical connector 202 into the header housing 340 and then to allow the contacts 328 to mate with the first electrical connector 202.

The contact actuator 410 includes a first side 412, a second side 414. The contact actuator 410 includes a front 416 and a rear 418. The contact actuator 410 includes a top 420 and a bottom 422. The first and second sides 412 are oriented parallel to the second PCB 300. The second side 414 faces the first side 342 of the header housing 340. The first side 412 defines the mating end 334 of the electrical connector 302. The top 420 and the bottom 422 face the top 350 and the bottom 352 of the header housing 340. The front 416 faces the front 346 of the header housing 340 and the rear 418 faces the rear 348 of the header housing 340.

In an exemplary embodiment, the contact actuator 410 includes a plate 430 having openings 432 at the first side 412 and pockets 434 at the second side 414 that receive corresponding contacts 328. The spring beams 370 are received in the pockets 434 and are configured to extend through the openings 432. For example, the tips 376 of the contacts 328 may extend through the openings 432 such that the mating interfaces 366 are configured be mated with the contacts 228 of the first electrical connector 202. In an exemplary embodiment, the contact actuator 410 engages the spring beams 370 and moves the spring beams 370 between compressed positions and released positions. For example, as the contact actuator 410 moves in the cavity 341 between the advanced position and the retracted position, the contact actuator 410 engages and compresses the spring beams 370 to protect the spring beams 370 from damage during mating with the first electrical connector 202.

In an exemplary embodiment, the electrical connector 302 includes a release mechanism 450 operably coupled to the contact actuator 410. The release mechanism 450 is used to move the contact actuator 410 in the cavity 341 between the advanced position and the retracted position. The release mechanism 450 may be coupled to the header housing 340, such as at the rear 338. The release mechanism 450 may be coupled to the rear 418 of the contact actuator 410. In the illustrated embodiment, the release mechanism 450 is a rocker configured to be rotated or pivoted to move the contact actuator 410. For example, the release mechanism 450 includes a bearing surface 452 configured to engage the rear 418 of the contact actuator 410 and an actuation surface 454 configured to be engaged by the electrical connector 202 when the electrical connector 202 is loaded into the cavity 341. For example, when the electrical connector 202 is nearly fully loaded into the cavity 341, the electrical connector 202 engages the actuation surface 454 causing the release mechanism 450 to rotate. The bearing surface 452 engages and pushes the contact actuator 410 forward, such as away from the rear 338. The release mechanism 450 moves the contact actuator 410 in a direction opposite the loading direction of the electrical connector 202 into the cavity 341. However, in other various embodiments, the release mechanism 450 may have an alternative position and/or may move the release mechanism 450 in a different direction, such as in a direction parallel to the loading direction or perpendicular to the loading direction. Other types of release mechanisms 450 may be used in alternative embodiments.

In an exemplary embodiment, the release mechanism 450 is used to move the contact actuator 410 from the advanced position to the retracted position. For example, the contact actuator 410 may be normally held in the advanced position and moved from the advanced position to the retracted position when the electrical connector 202 is fully mated with or nearly fully mated with the electrical connector 302. In the advanced position, the contact actuator 410 protects the contacts 328, such as by holding the contacts 328 in the compressed positions and the away from the electrical connector 202 is the electrical connector 202 is loaded into the cavity 341. When the contact actuator 410 is moved to the retracted position by the release mechanism 450, the contacts 328 are moved to the released positions for mating with the corresponding contacts 228 of the electrical connector 202. In an exemplary embodiment, the electrical connector 302 includes a return spring 456 operably coupled to the contact actuator 410 to return the contact actuator 410 to the advanced position to compress the contacts 328 and again provide protection for the contacts 328, such as during an unloading of the electrical connector 202 from the cavity 341.

Figure 11:
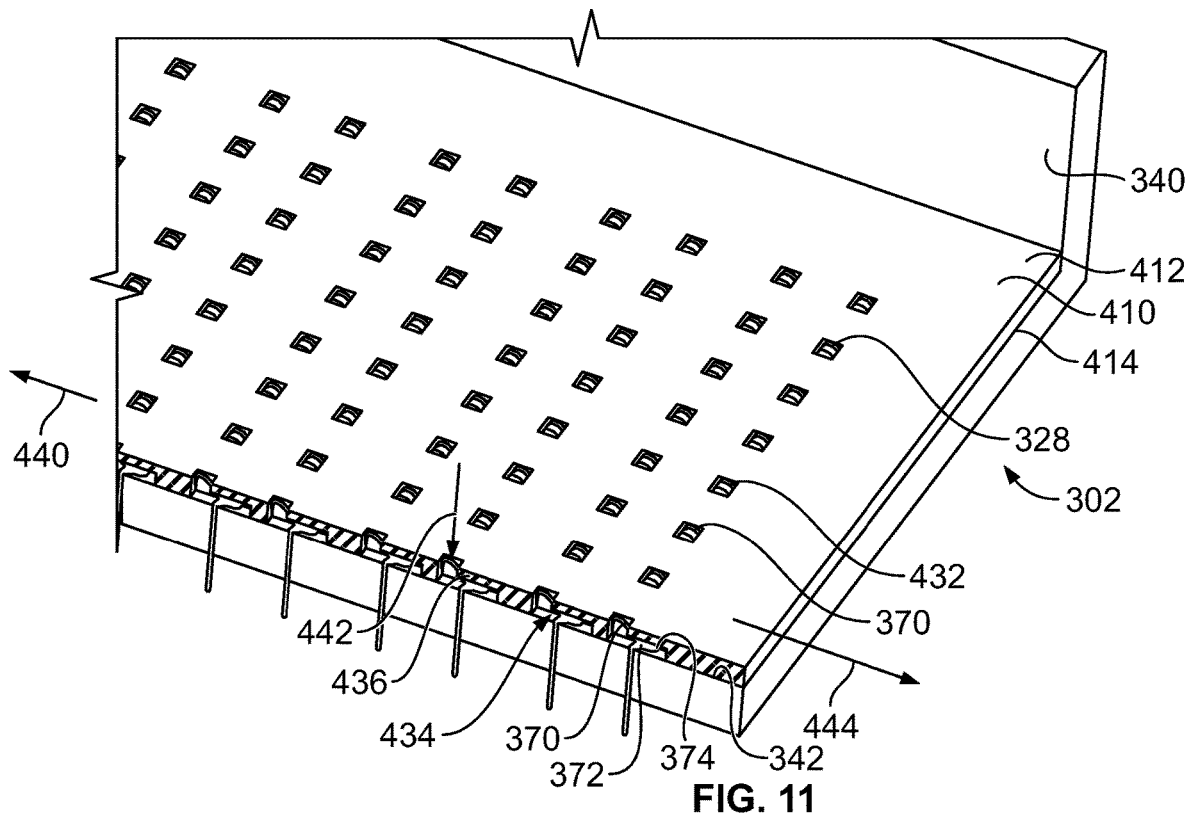
FIG. 11 is a sectional view of a portion of an electrical connector of the circuit card assembly shown in FIG. 10 in accordance with an exemplary embodiment.
Figure 12:
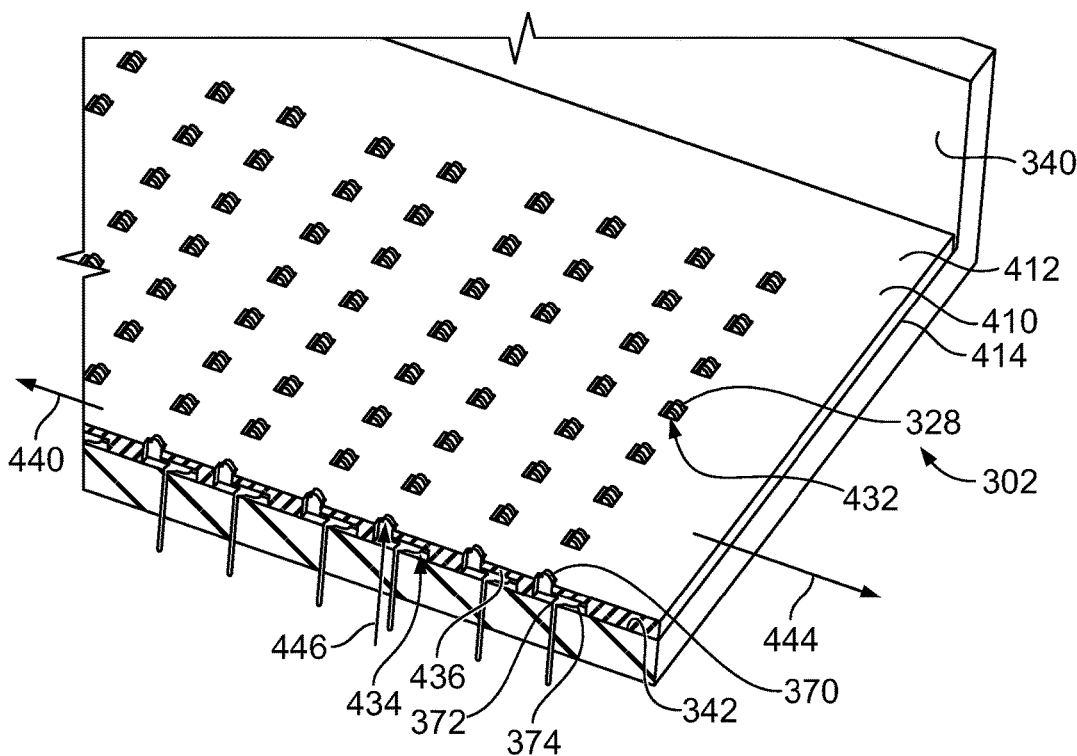
FIG. 12 is a sectional view of a portion of the electrical connector shown in FIG. 10 in accordance with an exemplary embodiment.

FIG. 11 is a sectional view of a portion of the second electrical connector 302 in accordance with an exemplary embodiment showing the contact actuator 410 in the advanced position holding the contacts 328 in compressed positions. FIG. 12 is a sectional view of a portion of the second electrical connector 302 in accordance with an exemplary embodiment showing the contact actuator 410 in the retracted position and the contacts 328 in the released positions.

The openings 432 are open at the first side 412. The pockets 434 are open at the second side 414. Each pocket 434 receives a corresponding base 372 and folded portion 374 of the contact 328. The pocket 434 is at least partially defined by a compression shoulder 436. The compression shoulder 436 is configured to engage the spring beam 370 and is used to compress the spring beam 370. Optionally, the compression shoulder 436 may be angled nonparallel to the first side 412, thus changing a width of the pocket 434 as the contact actuator 410 is moved relative to the contacts 328. In the illustrated embodiment, the compression shoulder 436 extends to the opening 432. As the contact actuator 410 is moved in an advancing direction 440, the compression shoulder 436 engages the spring beam 370 to compress the spring beam 370 in a compression direction 442 toward the first side 342 of the header housing 340 and toward the PCB 300. The compression shoulder 436 forces the spring beam 370 inward to compress the contact 328, making the contacts 328 narrower. The compression direction 442 is transverse to the advancing direction 440. Optionally, the compression direction 442 may be generally perpendicular to the advancing direction 440. As the contact actuator 410 is moved in a retracting direction 444, the compression shoulder 436 is moved relative to the spring beam 370 to allow the spring beam 370 to expand in a release direction 446. The contact 328 is allowed to widen, such as for mating with the contact 228 of the electrical connector 202. The spring beam 370 expands outward through the opening 432. The release direction 446 is transverse to the retracting direction 444. Optionally, the release direction 446 may be generally perpendicular to the retracting direction 444. The advancing direction 440 and the retracting direction 444 are actuation directions of the contact actuator 410.

Figure 13:
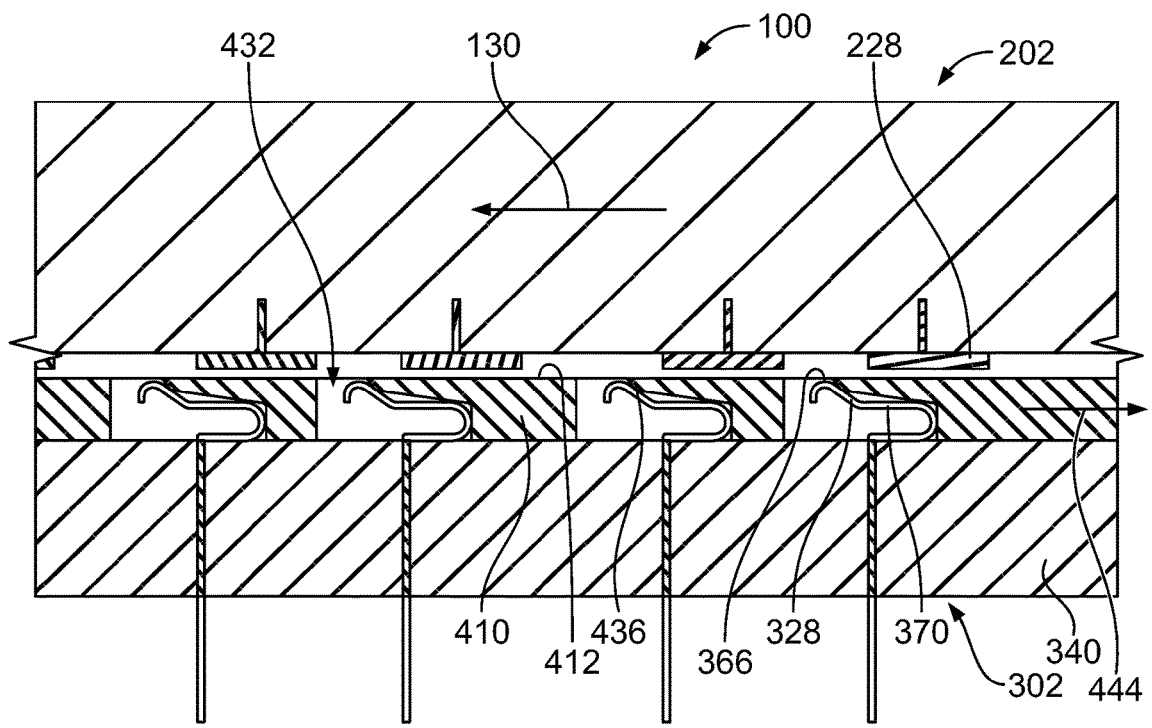
FIG. 13 is a cross-sectional view of a portion of the communication system showing the electrical connectors in accordance with an exemplary embodiment.
Figure 14:
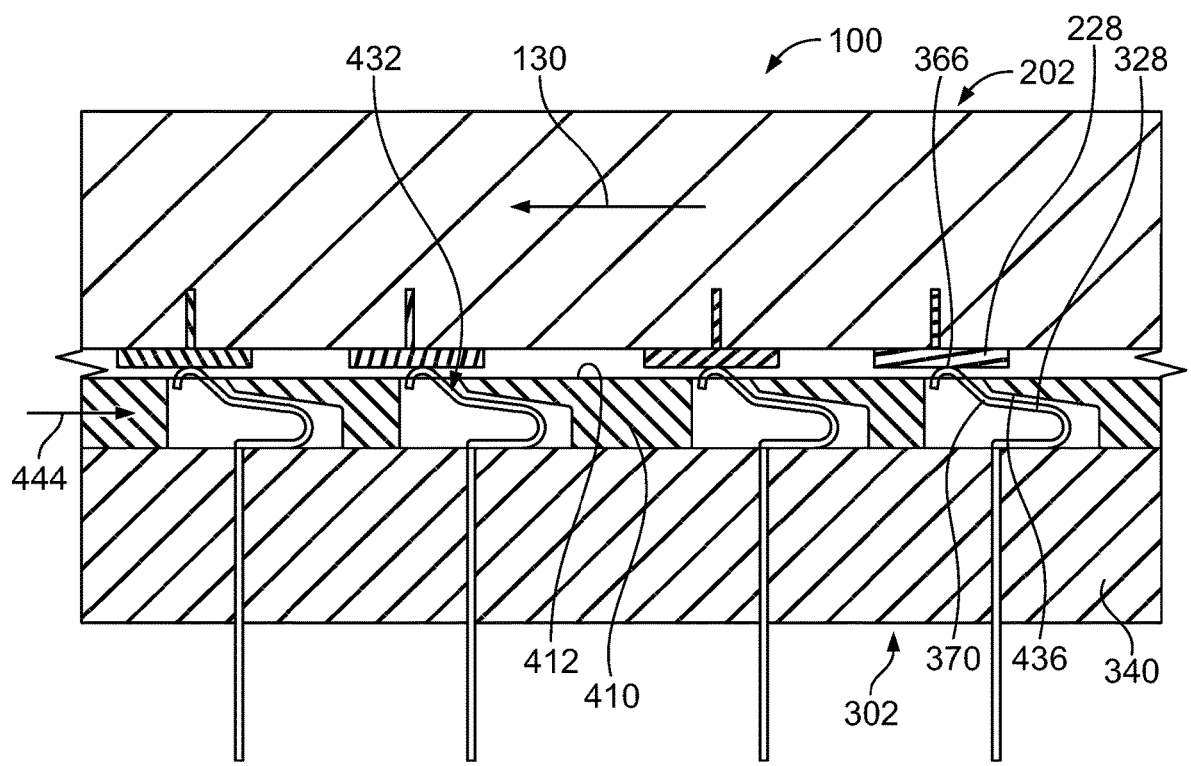
FIG. 14 is a cross-sectional view of a portion of the communication system showing the electrical connectors mated with each other in accordance with an exemplary embodiment.

FIG. 13 is a cross-sectional view of a portion of the communication system 100 showing the first electrical connector 202 partially mated with the second electrical connector 302 in accordance with an exemplary embodiment. FIG. 14 is a cross-sectional view of a portion of the communication system 100 showing the first electrical connector 202 mated with the second electrical connector 302 in accordance with an exemplary embodiment. FIG. 13 shows the contacts 328 of the second electrical connector 302 in compressed positions. FIG. 14 shows the contacts 328 of the second electrical connector 302 in released positions. The contact actuator 410 is shown in the advanced position in FIG. 13. The contact actuator 410 is shown in the retracted position in FIG. 14.

The contact actuator 410 is used to protect the contacts 328 during mating of the electrical connectors 202, 302. For example, as the electrical connector 202 is loaded into the header housing 340 in the loading direction 130, the contact actuator 410 holds the spring beams 370 in the compressed positions such that the mating interfaces 366 of the spring beams 370 are spaced apart from the electrical connector 202. The openings 432 may be offset from the mating ends of the contacts 328 when the contact actuator 410 is in the advanced position. The compression shoulders 436 engage the spring beams 370 and hold the spring beams 370 in the compressed positions. In the compressed positions, the contacts 228 do not wipe across the contacts 328 as the electrical connector 202 is loaded into the header housing 340. In the compressed positions, the contacts 328 are not inadvertently electrically connected to incorrect contacts 228 as the contacts 228 move past the contacts 328.

Once the electrical connector 202 is properly positioned relative to the electrical connector 302, the contact actuator 410 is moved to the retracted position to release the contacts 328. The contact actuator 410 is moved in the retracting direction 444 to align the openings 432 with the mating interfaces 366 of the spring beams 370. The mating ends of the contacts 328 are expanded through the openings 432 to the released positions. For example, in the released positions, the mating interfaces 366 are located outward of and stand proud of the first side 412 of the contact actuator 410 for interfacing with the contacts 228. The mating interfaces 366 of the spring beams 370 engage and electrically connect with the corresponding contacts 228 of the electrical connector 202 in the released positions. In an exemplary embodiment, the spring beams 370 extend outward of the first side 412 in the released positions to engage and electrically connect to the electrical connector 202. The spring beams 370 are compressed at or inward of the first side 412 in the compressed positions.

While the contact actuator 410 is illustrated as being part of the second circuit card assembly 122 coupled to the header housing 340 and movable to protect the contacts 328, it is realized that the contact actuator 410 may alternatively be provided as part of the first circuit card assembly 120. For example, the contact actuator 410 may be coupled to the mating housing 240 and movable to protect the contacts 228. For example, in such embodiment, the contacts 228 may be spring contacts 228 and the contacts 328 may be pads.

Figure 15:
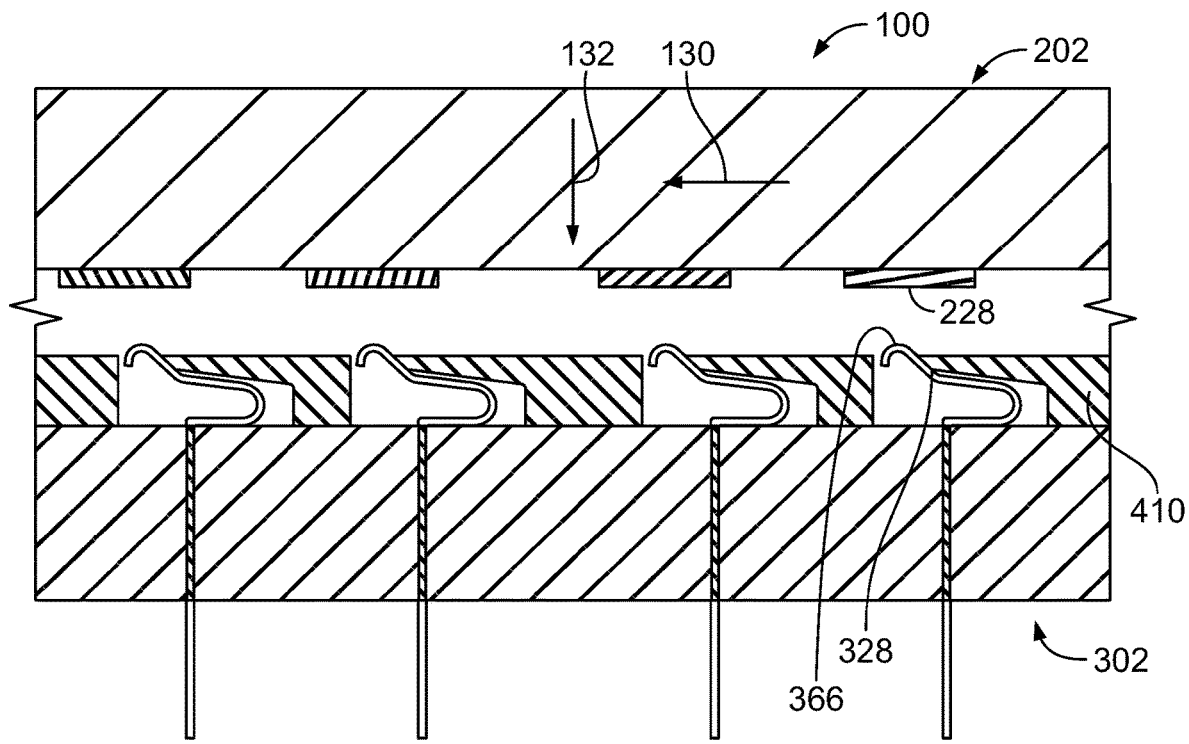
FIG. 15 is a cross-sectional view of a portion of the communication system showing the electrical connectors partially mated in accordance with an exemplary embodiment.
Figure 16:
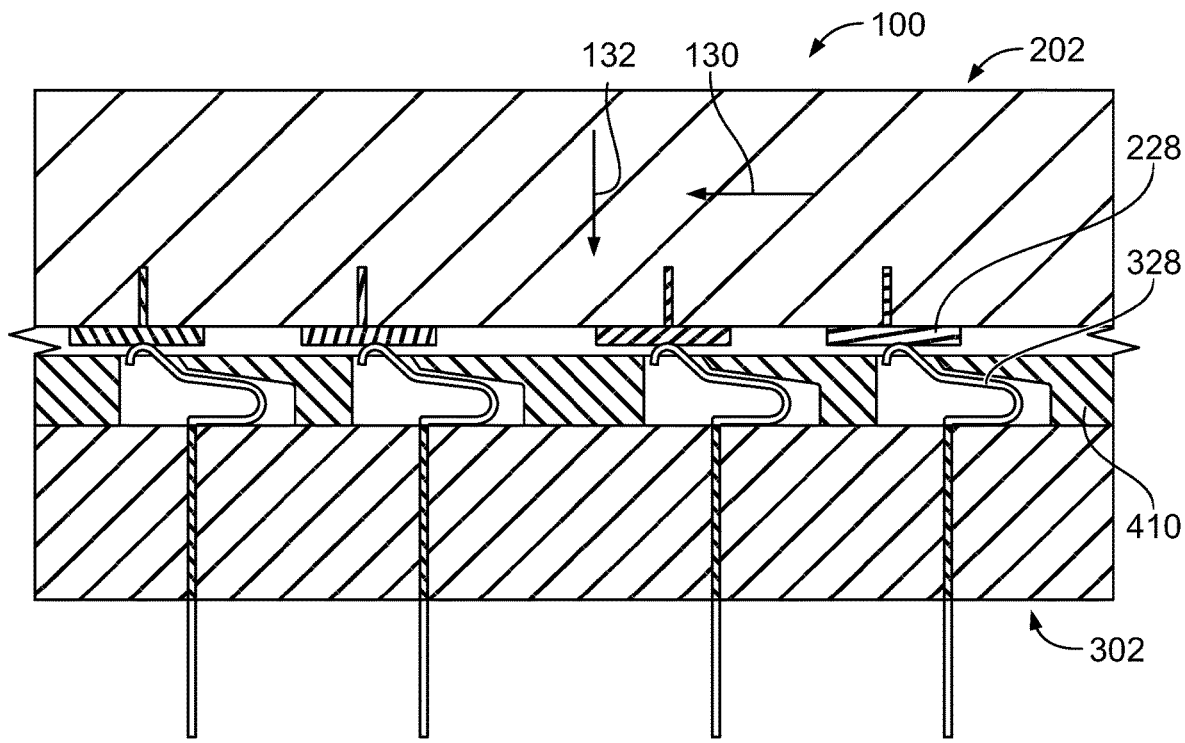
FIG. 16 is a cross-sectional view of a portion of the communication system showing the electrical connectors mated with each other in accordance with an exemplary embodiment.

FIG. 15 is a cross-sectional view of a portion of the communication system 100 showing the first electrical connector 202 partially mated with the second electrical connector 302 in accordance with an exemplary embodiment. FIG. 16 is a cross-sectional view of a portion of the communication system 100 showing the first electrical connector 202 mated with the second electrical connector 302 in accordance with an exemplary embodiment. The electrical connector 202 is moved in the connector mating direction 132 between a retracted position (FIG. 15) and an advanced position (FIG. 16). The connector mating direction 132 of the electrical connector 202 is generally perpendicular to the loading direction 130. FIGS. 15 and 16 illustrate the contact actuator 410 in the retracted position with the contacts 328 in the released positions. The contacts 228 of the electrical connector 202 are advanced toward the mating interfaces 366 of the contacts 328 as the electrical connector 202 is moved in the connector mating direction 132.

Figure 17:
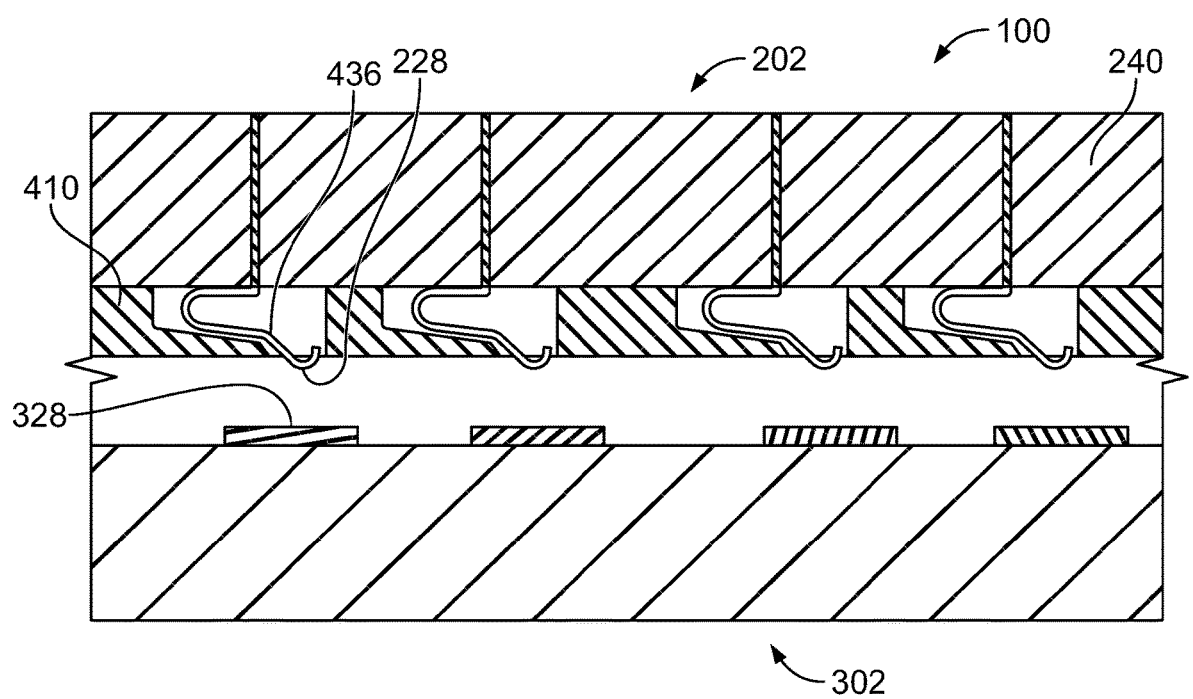
FIG. 17 is a cross-sectional view of a portion of the communication system in accordance with an exemplary embodiment.

FIG. 17 is a cross-sectional view of a portion of the communication system 100 in accordance with an exemplary embodiment showing the contact actuator 410 associated with the first electrical connector 202. The contact actuator 410 is coupled to the mating housing 240. The contacts 228 are spring contacts. The contacts 328 of the second electrical connector 302 are pads. The contact actuator 410 is used to protect the contacts 228 during mating of the electrical connectors 202, 302. For example, as the electrical connector 202 is mated with the header housing 340, the contact actuator 410 holds the spring beams of the contacts 228 in compressed positions. The compression shoulders 436 engage the contacts 228 and hold the contacts 228 in the compressed positions. In the compressed positions, the contacts 228 do not wipe across the contacts 328 as the electrical connector 202 is loaded into the header housing 340. In the compressed positions, the contacts 328 are not inadvertently electrically connected to incorrect contacts 228 as the contacts 228 move past the contacts 328.

Once the electrical connector 202 is properly positioned relative to the electrical connector 302, the contact actuator 410 may be moved to the retracted position to release the contacts 228. The contact actuator 410 is moved relative to the mating housing 240 to align the openings 432 with the mating interfaces of the contacts 228. The mating ends of the contacts 228 are expanded through the openings 432 to released positions.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A circuit card assembly for a communication system comprising:
    a printed circuit board (PCB) having a first surface and a second surface and a mating edge between the first and second surfaces, the PCB having a mounting area on the first surface proximate to the mating edge;
    an electrical connector mounted to the first surface at the mounting area configured for mating with a mating electrical connector, the electrical connector having a housing, the housing extending between a front and a rear, the front being provided proximate to the mating edge, the housing having a mating end extending between the front and the rear, the mating end configured to mate with the mating electrical connector, the housing holding contacts, the contacts having terminating ends being electrically connected to the PCB, the contacts having spring beams at the mating end, the spring beams having mating interfaces, the spring beams being deflectable relative to the housing; and
    a contact actuator coupled to the housing at the mating end, the contact actuator engaging the spring beams and moving the spring beams between compressed positions and released positions, the mating interfaces of the spring beams being held by the contact actuator spaced apart from the mating electrical connector in the compressed positions, the mating interfaces of the spring beams configured to engage and electrically connect with the mating electrical connector in the released positions.

2. The circuit card assembly of claim 1, wherein the contact actuator is movable between an advanced position and a retracted position, the contact actuator compressing the spring beams to the compressed positions when the contact actuator is moved to the advanced position, the contact actuator releasing the spring beams to the released positions when the contact actuator is moved to the retracted position.

3. The circuit card assembly of claim 1, wherein the contact actuator includes a plate having openings, the spring beams passing through the openings to the released positions.

4. The circuit card assembly of claim 3, wherein the plate is moved relative to the housing to compress the spring beams to the compressed positions.

5. The circuit card assembly of claim 1, wherein the contact actuator includes a plate having a first side and a second side, the spring beams extending outward of the first side in the released positions to engage and electrically connect to the mating electrical connector, the spring beams being compressed at or inward of the first side in the compressed positions.

6. The circuit card assembly of claim 5, wherein the plate includes openings allowing the spring beams to pass through the plate outward of the first side in the released positions.

7. The circuit card assembly of claim 5, wherein the plate includes pockets open at the second side to receive the contacts.

8. The circuit card assembly of claim 1, wherein the contact actuator includes compression shoulders engaging the spring beams to move the spring beams to the compressed positions, the compression shoulders configured to release the spring beams allowing the spring beams to move to the released positions.

9. The circuit card assembly of claim 1, wherein the contact actuator includes a release mechanism actuated by the mating electrical connector to move the contact actuator relative to the housing.

10. The circuit card assembly of claim 1, wherein the mating electrical connector is mated to the housing in a loading direction, the spring beams being movable between the compressed positions and the released positions in a release direction transverse to the loading direction.

11. The circuit card assembly of claim 1, wherein the contact actuator is movable in an actuation direction, the spring beams being movable between the compressed positions and the released positions in a release direction transverse to the actuation direction.

12. The circuit card assembly of claim 1, wherein the mating interfaces of the spring beams are movable closer to the PCB as the spring beams are moved from the released positions to the compressed positions.

13. The circuit card assembly of claim 1, wherein the PCB includes a slot open at the mating edge, the slot configured to receive a mating PCB hosting the mating electrical connector.

14. The circuit card assembly of claim 1, wherein the mating edge of the PCB is configured to be received in a slot of a mating PCB hosting the mating electrical connector.

15. A circuit card assembly for a communication system comprising:
a printed circuit board (PCB) having a first surface and a second surface and a mating edge between the first and second surfaces, the PCB having a mounting area on the first surface proximate to the mating edge;
an electrical connector mounted to the first surface at the mounting area configured for mating with a mating electrical connector, the electrical connector having a housing, the housing extending between a front and a rear, the front being provided proximate to the mating edge, the housing having a mating end extending between the front and the rear, the housing configured to be mated to the mating electrical connector in a loading direction parallel to the first surface, the housing holding contacts, the contacts having terminating ends being electrically connected to the PCB, the contacts having spring beams at the mating end, the spring beams having mating interfaces, the spring beams being deflectable relative to the housing; and
a contact actuator coupled to the housing and movable relative to the housing between an advanced position and a retracted position, the contact actuator engaging the spring beams and moving the spring beams between compressed positions and released positions as the contact actuator moves between the advanced position and the retracted position, the mating interfaces of the spring beams being held by the contact actuator spaced apart from the mating electrical connector in the compressed positions, the mating interfaces of the spring beams configured to engage and electrically connect with the mating electrical connector in the released positions.

16. The circuit card assembly of claim 15, wherein the contact actuator includes a plate having openings, the spring beams passing through the openings to the released positions.

17. The circuit card assembly of claim 15, wherein the contact actuator includes a plate having a first side and a second side, the spring beams extending outward of the first side in the released positions to engage and electrically connect to the mating electrical connector, the spring beams being compressed at or inward of the first side in the compressed positions.

18. The circuit card assembly of claim 15, wherein the contact actuator includes compression shoulders engaging the spring beams to move the spring beams to the compressed positions, the compression shoulders configured to release the spring beams allowing the spring beams to move to the released positions.

19. A communication system comprising:
a first circuit card assembly having a first printed circuit board (PCB) and a first electrical connector mounted to the first PCB proximate to a mating edge of the first PCB, the first electrical connector having a first mating end and first contacts at the first mating end, each of the first contacts having a first mating interface; and
a second circuit card assembly having a second PCB and a second electrical connector mounted to the second PCB proximate to a mating edge of the second PCB, the second electrical connector having a second mating end and second contacts at the second mating end, the second electrical connector having a housing holding the second contacts, the housing having a mating end mated to the second electrical connector in a loading direction, the contacts having spring beams at the mating end having second mating interfaces, the spring beams being deflectable relative to the housing, the second electrical connector having a contact actuator coupled to the housing and movable relative to the housing between an advanced position and a retracted position, the contact actuator engaging the spring beams and moving the spring beams between compressed positions and released positions as the contact actuator moves between the advanced position and the retracted position, the second mating interfaces of the spring beams being held by the contact actuator spaced apart from the first contacts in the compressed positions, the second mating interfaces of the spring beams engaging and being electrically connect with the first mating interfaces of the corresponding first contacts in the released position;
wherein at least one of the first PCB and the second PCB includes a slot receiving the other of the first PCB and the second PCB in the loading direction along a loading axis.

20. The communication system of claim 19, wherein the contact actuator includes compression shoulders engaging the spring beams to move the spring beams to the compressed positions, the compression shoulders configured to release the spring beams allowing the spring beams to move to the released positions.

* * * * *